(12) United States Patent
Sayyah

(10) Patent No.: US 6,509,812 B2
(45) Date of Patent: Jan. 21, 2003

(54) CONTINUOUSLY TUNABLE MEMS-BASED PHASE SHIFTER

(75) Inventor: Keyvan Sayyah, Santa Monica, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 09/802,151

(22) Filed: Mar. 8, 2001

(65) Prior Publication Data

US 2002/0186098 A1 Dec. 12, 2002

(51) Int. Cl.[7] ................................................. H01P 1/18
(52) U.S. Cl. .................... 333/156; 333/161; 333/164
(58) Field of Search ................................ 333/156, 161, 333/164, 139

(56) References Cited

U.S. PATENT DOCUMENTS

| | | | | |
|---|---|---|---|---|
| 4,395,687 A | * | 7/1983 | Belohoubek | 333/164 |
| 4,663,594 A | | 5/1987 | Perkins | 328/155 |
| 4,833,340 A | | 5/1989 | Deguchi | 307/262 |
| 4,837,532 A | | 6/1989 | Lang | 333/164 |
| 5,307,031 A | * | 4/1994 | Dick | 333/28 R |
| 5,736,883 A | * | 4/1998 | Vidovich | 327/276 |
| 5,939,918 A | | 8/1999 | McGarry et al. | 327/247 |

FOREIGN PATENT DOCUMENTS

| | | |
|---|---|---|
| EP | 0 462 338 | 12/1991 |
| EP | 0 840 394 | 5/1998 |

OTHER PUBLICATIONS

Brown, E.R., "RF–MEMS Switches for Reconfigurable Integrated Circuits," *IEEE Transactions on Microwave Theory and Techniques*, 46 (11), pp. 1868–1880, 1998.

Barker, N.S., "Distributed MEMS True–Time Delay Phase Shifters and Wide–Band Switches," *IEEE Transactions on Microwave Theory and Techniques*, 46 (11), pp. 1881–1890, 1998.

Ghorbani, K., et al., "A Novel Wide–Band Tunable RF Phase Shifter Using a Variable Optical Directional Coupler," *IEEE Transactions on Microwave Theory and Techniques*, 47 (5), pp. 645–648, 1999.

Yao, Z.J., et al., "Micromachined Low–Loss Microwave Switches," *IEEE Journal of Microelectromechanical Systems*, 8 (2), pp. 129–134, 1999.

"Voltage Controlled Phase Shifters," TRAK Microwave Corp. (Florida) Specification, pp. 1–3, 1997.

Barker, N.S. et al., "Optimization of Distributed MEMS Transmission–Line Phase Shifters—U–Band and W–Band Designs," *IEEE Transactions on Microwave Theory and Techniques*, vol. 48, No. 11, Part 1, pp. 1957–1965 (Nov. 2000).

* cited by examiner

*Primary Examiner*—Robert Pascal
*Assistant Examiner*—Joseph Chang
(74) *Attorney, Agent, or Firm*—Ladas & Parry

(57) ABSTRACT

A phase shifter comprises a coarse phase tuning arrangement and a fine phase tuning arrangement. The coarse phase tuning arrangement provides a discrete number of phase shifts. The fine phase tuning arrangement includes a RLC network, having a resistor, an inductor and a capacitor. The fine phase tuning arrangement also comprises an optical arrangement for varying the resistance value of the resistor. This phase shifter is able to obtain broadband, continuous 360° phase shifting also at Gigahertz frequencies. It also allows close to linear phase shift versus frequency resulting in true time delay capability, very low insertion loss and high value of maximum phase adjust.

30 Claims, 4 Drawing Sheets

CONTINUOUSLY TUNABLE MEMS-BASED PHASE SHIFTER

BACKGROUND OF THE INVENTION

1. Field of the Invention

The present invention relates to phase shifters and more particularly to a compact and continuously variable phase shifter based on solid state semiconductors.

2. Description of the Related Art

Current commercial variable phase shifters, like for example those sold from TRAK Microwave Corp. (Florida), typically comprise varactor diodes which have limited maximum phase shifts of less than 120° and limited bandpass operation of less than 1 GHz.

However, changing the operation bandpass requires changing the appropriate diode coupling impedance elements. Moreover, phase shifts of more than 120° can only be obtained by cascading more than one device.

Another type of prior art variable phase shifter comprises a coplanar-waveguide transmission line periodically loaded with MEMs variable capacitors, i.e. capacitors realized through arrays of microelectromechanical switches. Analog control is provided by electrostatic control of the capacitors. An introductory note to MEMS switches can for example be found in "RF-MEMS Switches for Reconfigurable Integrated Circuits", Elliott R. Brown, IEEE Transactions on Microwave Theory and Techniques, Vol. 46, No. 11, November 1998. A coplanar-waveguide transmission line is disclosed in "Distributed MEMS True-Time Delay Phase Shifters and Wide-Band Switches", N. Scott Barker, IEEE Transactions on Microwave Theory and Techniques, Vol. 46, No. 11, November 1998.

The disadvantage of this second approach is that a large number of these capacitors are needed to have a significant combined effect on the loaded transmission line for phase control due to limited (about 30%) variation in the MEMs capacitance values. For example, a 10 mm loaded line with 32 MEMs air bridges is required to provide a 2°/GHz phase shifting.

Still another type of variable RF phase shifter comprises a voltage variable optical coupler fabricated from $LiNbO_3$, combined with an optical fiber delay line. See for example "A Novel Wide-Band Tunable RF Phase Shifter Using a Variable Optical Directional Coupler", K. Ghorbani, A. Mitchell, R. B. Waterhouse, and M. W. Austin, IEEE Transactions on Microwave Theory and Techniques, Vol. 47, No. 5, May 1999.

Again, the maximum phase shift of this device is fairly limited, with a tunable range from 40° to 80° at a maximum operating frequency of only 80 MHz. Also, the insertion loss of this device can be up to 8 dB at 80 MHz. Furthermore, devices based on $LiNbO_3$ are quite expensive.

There is, therefore, a need for a simple, compact-size and low cost phase shifter which is able to obtain broadband, continuous 360° phase shifting also at Gigahertz frequencies.

SUMMARY OF THE INVENTION

The present invention relates to a novel, compact size, continuously variable phase shifter, in particular for use in the radiofrequency (RF) domain. This novel phase shifter can also be applied to other bands lower in frequency such as VHF (Very High Frequency), UHF (Ultra High Frequency), or higher frequency bands such as microwave or millimeter wave as well. According to a first aspect of the present invention, a phase shifter is disclosed, which comprises a digital binary microelectromechanical (MEMs)-based phase shifter for coarse phase tuning, and a resistor, inductor and capacitor (RLC) network for fine phase tuning serially connected to the digital binary coarse phase shifter, wherein fine phase tuning is achieved by continuously varying the resistance value through variable optical power.

According to a second aspect of the present invention, a continuous phase shifting method is provided, comprising the steps of: providing a RLC network having a resistor, an inductor and a first capacitor; and optically continuously varying the resistance value of the resistor.

As a result, a very compact size variable phase shifter is obtained with broadband, continuously variable phase shifting from 0° to 360°. This phase shifter can be fully integrated on conventional semiconductors such as Si or GaAs. According to a preferred embodiment of the present invention, the RLC network acts as a low pass filter with a very low insertion loss and a close to linear phase delay versus frequency response. Moreover, the phase shifter according to the present invention has the capability of broadband operation. Its bandwidth can be easily varied by changing the values of the inductor L and/or capacitor C in the RLC network. Thus, by switching the values of these parameters using another set of MEMs switches, a compact phase shifter with the capability of in-situ bandwidth switching can be realized.

Therefore, the advantages of the present invention can be summarized as follows: compact size, broadband operation with an in-situ switchable bandwidth, close to linear phase shift versus frequency resulting in true time delay capability, very low insertion loss and high value of maximum phase adjust.

Further to this, it has to be noted that in the phase shifter according to the present invention less than 10 MEMs switches combined with the RLC network are required in order to obtain continuous 360° phase shifting. Moreover, the maximum phase adjust is greater than in prior art devices.

Still a further advantage of the present invention is that of providing an inexpensive device, due to the fact that commercial Si or GaAs technologies are used.

BRIEF DESCRIPTION OF THE DRAWINGS

The present invention will be understood and appreciated more fully from the following detailed description taken in conjunction with the drawings, in which.

DETAILED DESCRIPTION OF THE INVENTION

Reference will be now made to the drawings where the showings are for the purpose of describing the preferred embodiment of the invention and not for limiting same.

Figure 1:
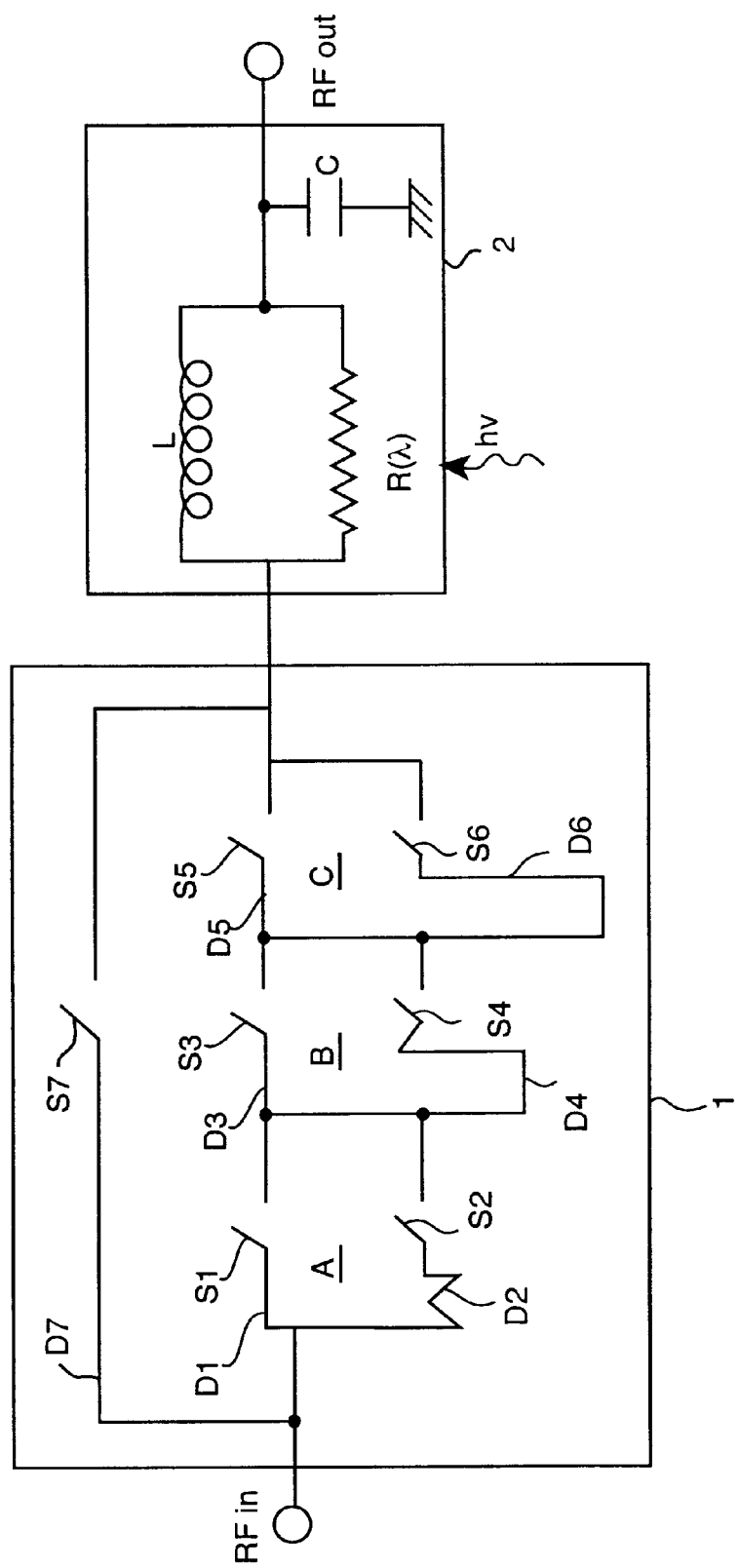
FIG. 1 shows a schematic block diagram of the phase shifter according to the present invention.

FIG. 1 shows a preferred embodiment including a schematic block diagram of the phase shifting device according to the present invention. The RF signal to be phase shifted is inputted at input $Rf_{in}$ and passes through a 3-bit binary coarse phase shifting block 1. The coarse phase shifting block 1 comprises a series of MEMs-switched delay lines D1 to D6, each fitted with respective switches S1 to S6. In particular, block 1 comprises three sections A, B, C. Each of these three sections A, B, C has two arms of different electrical lengths and contains two switches to force the RF signal down one or the other of the arms. With reference to FIG. 1, section A has arms D1, D2 having respective switches S1, S2. Section B has arms D3, D4 having respective switches S3, S4 and section C has arms D5, D6 having respective switches S5, S6. This provides 8 ($=2^3$) possible phase shifts of 45°, 90°, 135°, 180°, 225°, 270°, 315° and 360° at the RF frequency of interest by routing the signal through the appropriate electrical delay lines. For example, the length of the arms could be chosen according to the following Table 1, where d is a predetermined value.

TABLE 1

| Arm | Length |
|---|---|
| D1 | d |
| D2 | 4d |
| D3 | d |
| D4 | 7d |
| D5 | d |
| D6 | 13d |

The total length of the delay line for 360° phase shift (24d) at 2 GHz operational frequency is about 3.4 inches. This value applies to gold lines on a silica substrate with a width of 52 mils resulting in 50Ω microstrip lines. For gold lines on alumina substrates this length of delay line is about 2.3 inches with a microstrip width of 24 mils. According to the layout of the 3-bit coarse phase shifter shown in FIG. 1, a total length of 24d corresponds to a 360° phase shift. Therefore, at 2 GHz, the value for d is about 142 mils and 96 mils for the silica and alumina substrates, respectively.

The following Table 2 gives a matricial representation for the various possible statuses of the switches S1 to S6, where the wording ON indicates that the switch is closed and the wording OFF indicates that the switch is open and where the resulting length of each subpath is taken from the values shown in Table 1.

TABLE 2

| S1 | S2 | S3 | S4 | S5 | S6 | Path length | Three-bit status | | | Phase shift |
|---|---|---|---|---|---|---|---|---|---|---|
| ON | OFF | ON | OFF | ON | OFF | 3 d | 1 | 1 | 1 | 45° |
| OFF | ON | ON | OFF | ON | OFF | 6 d | 0 | 1 | 1 | 90° |
| ON | OFF | OFF | ON | ON | OFF | 9 d | 1 | 0 | 1 | 135° |
| OFF | ON | OFF | ON | ON | OFF | 12 d | 0 | 0 | 1 | 180° |
| ON | OFF | ON | OFF | OFF | ON | 15 d | 1 | 1 | 0 | 225° |
| OFF | ON | ON | OFF | OFF | ON | 18 d | 0 | 1 | 0 | 270° |
| ON | OFF | OFF | ON | OFF | ON | 21 d | 1 | 0 | 0 | 315° |
| OFF | ON | OFF | ON | OFF | ON | 24 d | 0 | 0 | 0 | 360° |

Thus, by selecting the appropriate MEMs switches, the range of the overall phase shift can be determined. For example, a coarse phase shift of 225° can be obtained by closing switches S1, S3 and S6. This will create a path for the incoming signal, whose length is D1+D3+D6=d+d+13d=15d=225°.

It has also to be noted that block 1 comprises a seventh arm D7 and a seventh MEM switch S7 which applies no initial phase shift and which forces the RF signal directly through the second segment of the variable phase shifter, in order to provide continuous phase tuning also in the range of 0°–45°. The path length in this case will be the same length of that for obtaining a 360° phase shift, i.e. 24d. Of course, also embodiments without the arm D7 are possible, because the 360° phase shift can be obtained with the combination S2=S4=S6 as shown in Table 2.

The phase shifter according to the present invention also comprises a fine phase shifting block 2, serially connected to the coarse phase shifting block 1. The purpose of this fine phase shifting block 2 is that of providing an additional fine phase shifting in the range between 0° and 45°. Should for example the phase shifter need to perform a shifting operation of 218°, then block 1 will perform a coarse phase shifting of 180° and block 2 will perform an additional fine phase shifting of 38°.

Block 2 comprises a RLC network in which the resistor $R(\lambda)$ is a photoconductor whose resistance can be continuously varied by means of an optical energy hv. In the preferred embodiment shown in FIG. 1, the resistor $R(\lambda)$ is in parallel with an inductor L and the parallel combination between $R(\lambda)$ and L is in series with a shunt capacitor C. For low frequencies (<1 GHz) it is preferred to use discrete lumped elements for the inductor L and the capacitor C. For higher frequencies (>1 GHz) distributed open and shunt microstrip lines can be used for the inductor L and the capacitor C.

FIG. 1 shows a hybrid parallel-series RLC configuration. Other configurations of the RLC network are also possible. However, the parallel combination of the resistor and inductor in series with a shunt capacitor of FIG. 1 is the preferred one, resulting in a near linear phase shift vs. frequency characteristics as well as low insertion loss.

An AC analysis of this RLC network of FIG. 1 in a system having a source $V_s$, a load of 50Ω and an output voltage $V_O$ yields to the following closed form expressions for the magnitude $|v_O/v_s|$ and phase $<v_O/v_s$ of its voltage transfer function $v_O/v_s$:

$$|v_O/v_s|=(R^2+\omega^2L^2)^{1/2}/[(2R-\omega^2LRC-50\omega^2LC)^2+\omega^2(2L+0.02RL+50RC)^2]^{1/2} \quad (1)$$

$$<v_O/v_s=\tan^{-1}(\omega L/R)-\tan^{-1}[\omega(2L+0.02RL+50RC)/(2R-\omega^2LRC-50\omega^2LC)] \quad (2)$$

where ω is the angular frequency. Equation (1) above indicates that the voltage transfer function is a low pass filter with a 3 dB bandwidth obtained from the following equation:

$$[(R+50)^2L^2C^2]\omega^4+[4(1+0.02R)^2L^2+50^2R^2C^2+200(1+0.02R)LCR-4LCR(R+50)-8L^2]\omega^2-4R^2=0 \quad (3)$$

Equation (3) is obtained from Equation (2) by setting the amplitude $|v_O/v_s|$, which is a function of ω (the angular frequency), to $\sqrt{2}/2$ (which is equal to −3 dB). The resulting Equation (3) determines the 3 dB frequency as a function of the R, L and C values. At frequencies above this, the insertion loss of the network (which is equal to $|v_O/v_s|$) exceeds 3 dB and the phase shifter becomes lossy.

Figure 2:
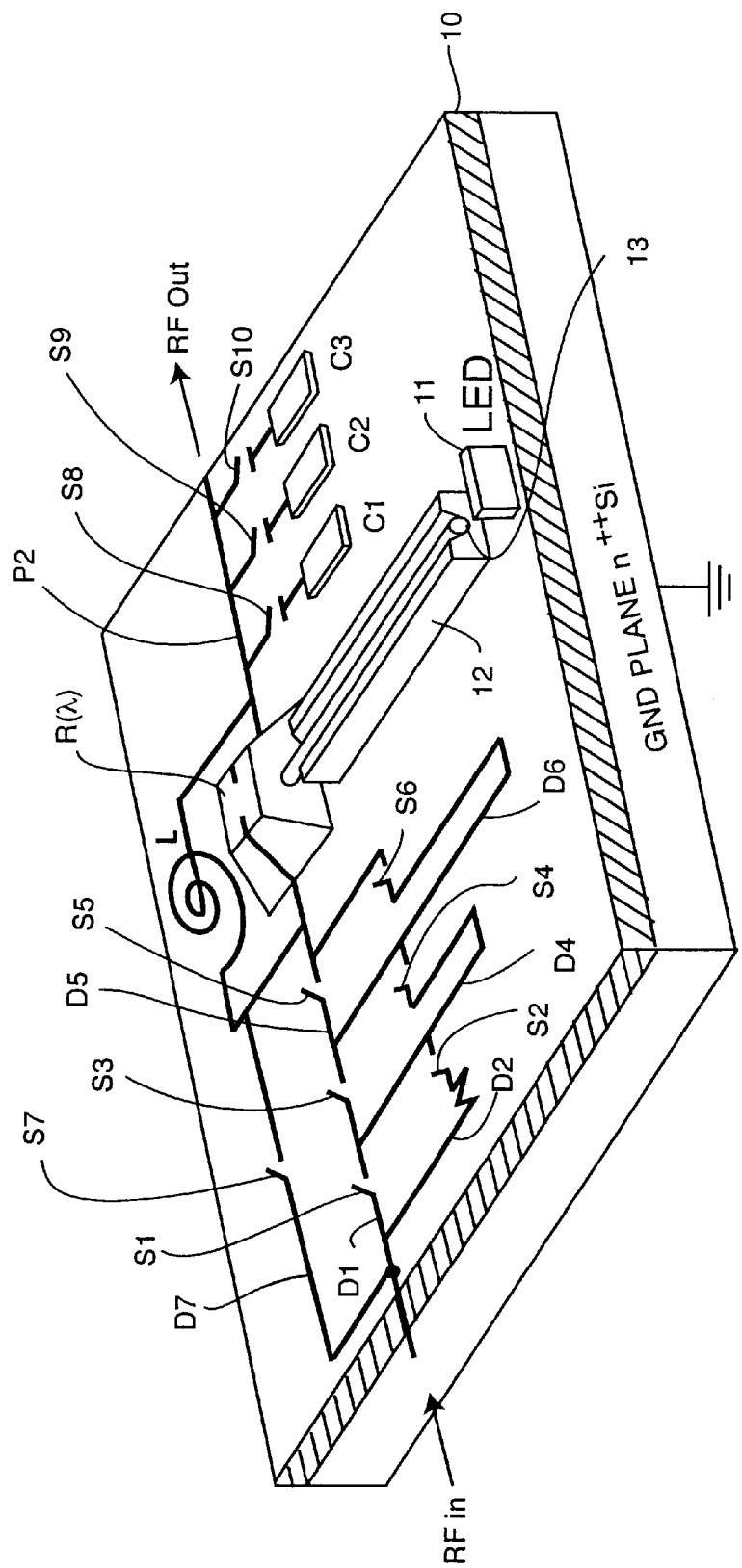
FIG. 2 shows a perspective view of the embodiment of FIG. 1.

FIG. 2 illustrates the preferred embodiment of this invention, in which a bonded silicon-on-insulator (SOI) substrate with a thermally grown $SiO_2$ layer 10 separating two Si layers is used to construct the phase shifter. An example of the top Si layer in FIG. 2 is the volume encompassed by the photoresistor as well as the groove in which the fiber 12 is located.

The electrical input and output of the device, as well as the various delay lines in the binary phase shifter, are preferably microstrip lines made using a conductor, such as gold, on the insulating oxide ($SiO_2$) layer 10 in areas where the top Si layer is removed. The RF MEMs switches are constructed using the well established bulk Si micromachining technology on the top Si layer. For a reference to this technology, see for example "Micromachined Low-Loss Microwave Switches", Z. Jamie Yao, Shea Chen, Susan Eshelman, David Denniston, and Chuck Goldsmith, IEEE Journal of Microelectromechanical Systems, Vol. 8, No. 2, June 1999.

When compared with FIG. 1, FIG. 2 shows three additional switches S8, S9 and S10 and three capacitors C1, C2 and C3. These switches are built to switch the value of the phase range determining capacitor C1, C2 or C3 in the RLC network. At each time only one switch (that is one capacitor) is ON.

The connections of the switches to a switch controlling device are not shown in the figure, for clarity purposes. The MEMs switches are controlled electrostatically by a DC control voltage applied to their control terminal.

The inductor L of the RLC network is realized as a spiral inductor monolithically fabricated using a conductor, such as gold, on the insulating oxide layer. Other embodiments of the inductor L include commercial miniature spiral inductors fabricated on alumina or silica substrates and then epoxy bonded to the phase shifter substrate with its terminals wire bonded to the rest of the circuit on this substrate. The proposed embodiment is preferred because it is monolithic with the phase shifter substrate resulting in less parasitic values and a more compact and less expensive device.

The capacitors C1–C3 of this network are fabricated using a metal-oxide-semiconductor structure, where the underlying semiconductor is heavily doped using ion implantation to serve as one electrode. Other embodiments of the capacitors C1–C3 include commercial miniature chip capacitors which are then epoxy bonded to the phase shifter substrate with its terminals wire bonded to the rest of the circuit on this substrate. The proposed embodiment is preferred because it is monolithic with the phase shifter substrate resulting in less parasitic values and a more compact and less expensive device.

The photoresistor R ($\lambda$) of the RLC network is formed using the top Si layer which is very lightly doped to result in a high dark-state resistance, as described above. The range of the Si layer doping is usually $10^{12}$ to $10^{14}$ cm$^{-3}$. An inexpensive LED 11 emitting at photon energies above the bandgap of the semiconductor (in this case Si) can be epoxy bonded on the bonded SOI substrate to provide the optical energy required to continuously vary the resistance of the photoresistor in the RLC network. A LED or laser diode in the chip (not packaged) form is preferred in order to have a more compact overall device. Also, the emission spectrum of the LED or laser diode should be compatible with the semiconductor material used for the photoresistor. For the preferred embodiment of Si, optical emission wavelengths in the range of 400–1000 nm are required.

The light from the LED 11 can be coupled to the photoresistor using waveguides constructed on the bonded SOI substrate or using an optical fiber 12 as shown in FIG. 2. In this configuration, V-grooves 13 can be etched in the top Si layer of the bonded SOI substrate to form a support for the optical fiber. The V-grooves 13 are the exposed crystallographic planes of the semiconductor formed by wet etching. A multimode fiber can be used in this case for improved optical coupling to the LED 11 and the photoresistor R ($\lambda$), as well as to maximize the optical power handling capability of the fiber. The end result is a compact, monolithic and inexpensive RF variable phase shifter which has the capability of continuous true-time-delay phase shifting.

Other embodiments could include an optical waveguide fabricated in the phase shifter substrate replacing the fiber and the groove with the commercial LED or laser diode chip bonded next to and optically coupled to the waveguide. Alternatively, if the photoresistor active layer is a III-V material such as GaAs, for example, the LED or laser diode can be monolithically fabricated into this layer and optically coupled to the waveguide or fiber thus making the resulting phase shifter even more compact and cost effective.

It has to be noted that conventional RF variable phase shifters, which comprise delay lines of variable length, have a linear phase shift vs. frequency characteristics whose slope increases as the delay line length increases. The change in the delay line length is obtained mechanically. One of the specifications of these phase shifters is the slope of this phase shift-frequency characteristics which has a unit of degrees of phase shift per unit frequency at the maximum length of the delay line. This figure is referred to as the maximum phase adjust. For example, a variable phase shifter with a 60°/GHz maximum phase adjust provides a phase shift of 60° at 1 GHz and 360° at 6 GHz operation frequencies, assuming it is operational in this range of frequencies. Another characteristic of these phase shifters is their operational bandwidth which is the range of frequencies in which their maximum phase adjust is valid and in which they have a reasonably low (0 to −3 dB, for example) insertion loss. In the above example, if the phase shifter has a frequency range of operation (bandwidth) of 0–10 GHz, the phase shift would obviously be 0° at DC and 600° at 10 GHz if the delay length is set at maximum phase adjust. Furthermore, at each frequency of operation, the phase shift can also be varied from 0 to the maximum available for that frequency by adjusting the delay length. In the above example, a variable phase shift from 0° to 120° is obtained at 2 GHz by varying the length of the delay line from 0 to maximum phase adjust.

In sharp contrast with prior art phase shifters, the variable phase shifter according to the present invention has the advantages of very high maximum phase shift operational at very broad range of frequencies concurrent with analog fine phase tuning, low insertion loss, and close to linear phase shift vs. frequency characteristics. Ideally, it is desired to have a very high maximum phase adjust operational at a very broad range of frequencies together with very fine control of phase shift and very low insertion loss. The desirable value for the maximum phase adjust depends on the frequency of operation. For example, if the maximum frequency of operation is 2 GHz, a maximum phase adjust of 180°/GHz or more is required in order to obtain a maximum phase shift of 360° or more at this frequency. However, due to the linear phase shift vs. frequency dependence, the maximum phase shift available is less than 360° for frequencies below 2 GHz. The value of 180°/GHz for the maximum phase adjust for the phase shifter according to the present invention is obtained by selecting appropriate lengths for the delay lines of the coarse digital tuning block, as already described.

The fine control of phase shift, which is obtained by the RLC fine analog tuning block in the phase shifter according to the present invention, is preferably below 0.1°. This value of phase shift adjust is easily obtained by the phase shifter according to the present invention by the continuous analog adjust capability of the LED or laser diode source which in turn results in continuous adjustment of the value of the photoresistor. A low insertion loss of below −3 dB can be obtained in the operational frequency range of interest.

The preferred embodiment of the present invention provides the above desired low insertion loss (<−3 dB ) and a substantially linear phase angle versus frequency response for true time delay operation in the desidered bandwidth. In order to obtain this, appropriate values of R, L and C have to be calculated making use of the previously described equations. Due to the complexity of such equations, a circuit analysis software, such as Libra™ (produced by Agilent Technologies), has been used to simulate the frequency dependence of the phase angle and insertion loss of the above RLC network.

In this regard, FIGS. 3A–3C and 4A–4C show the frequency dependence of the phase angle and insertion loss respectively, for preferred cases where L=3 nH and C=0.1, 0.75 and 2 pF while R is varied between 1 to 100Ω resulting in a 2 GHz bandwidth phase shifter.

As the simulation data in these figures indicate, the phase delay is close to being linear and the insertion loss is less than 3 dB for frequencies below 2 GHz.

Three different capacitor values have been chosen in order to cover the full range of 0°–45° phase tuning. Each capacitor value covers a portion of the full 0°–45° range. Thus, by switching these three capacitors, for example by use of another 3 MEMs switches, the full range of phase tuning can be obtained.

Figure 3A:
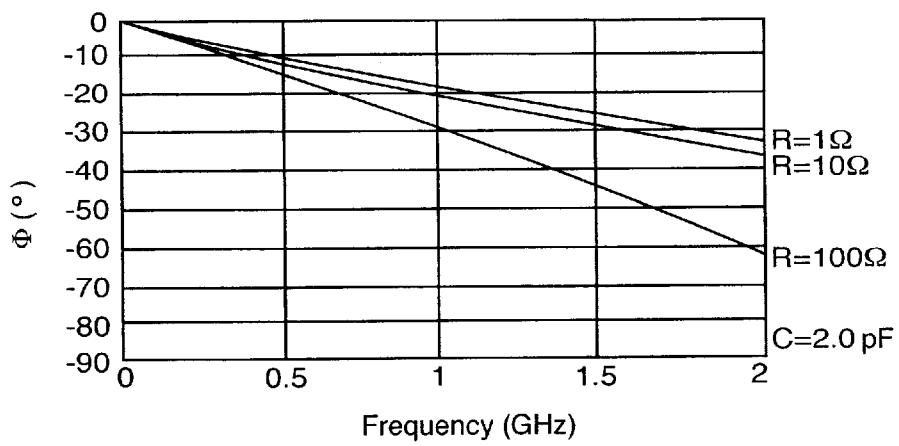
FIGS. 3A–3C show the frequency dependence of the phase angle for one embodiment of this invention with values of the capacitances C1, C2 and C3.
Figure 3B:
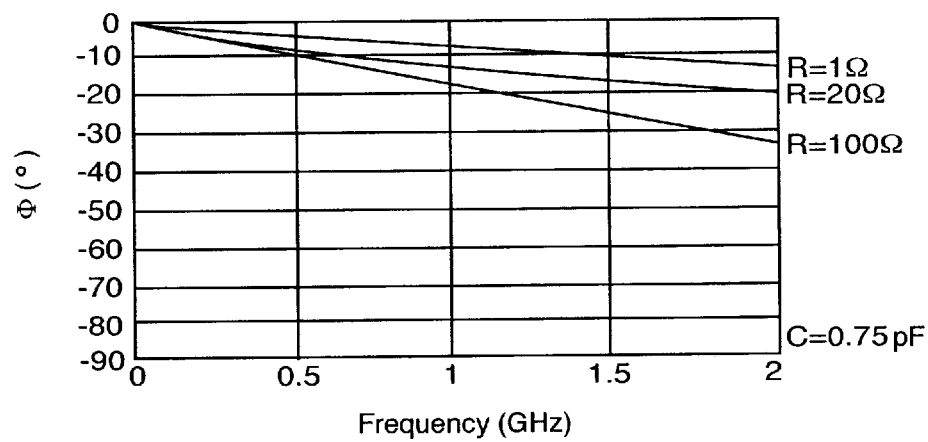
Figure 3C:
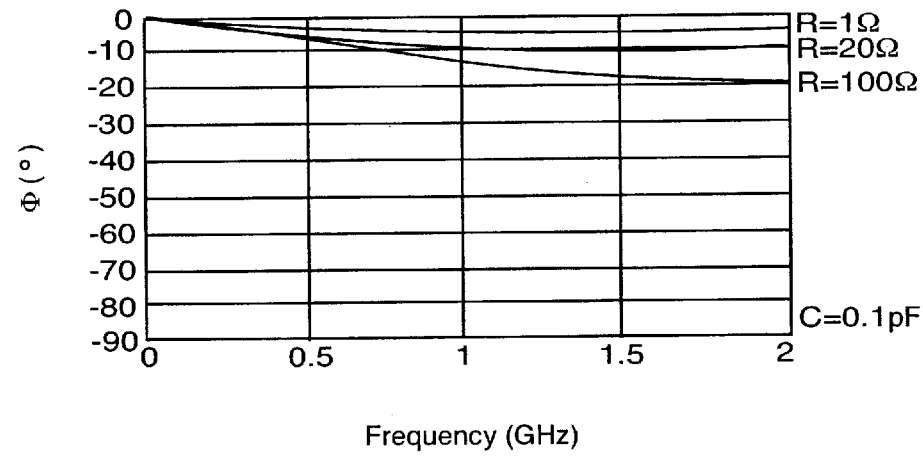

As the simulation results in FIGS. 3A, 3B and 3C indicate, a resistance change of about two orders of magnitude (1 to 100Ω) allows to obtain the full extent of phase change possible for each range of phase shift offered by each of the three range defining capacitance values. FIGS. 3A, 3B and 3C illustrate the simulated phase shift vs. frequency for the analog fine tuning stage of the phase shifter according to the present invention as a function of the photoinduced resistor values of 1, 10 and 100Ω, and range switching capacitor values of 0.1, 0.75 and 2 pF. These values of C combined with an inductance value of L=3 nH have been designed to result in a fine tuning stage which can deliver a continuously variable phase shift of 0° to 60° as the photoresistor value is varied from 1 to 100Ω via optical illumination at an operational frequency of 2 GHz. Since the minimum requirement of this segment of the device is to deliver a maximum phase shift of 45° at the frequency of interest, this design does indeed exceed that requirement. In fact, a maximum phase shift of 45° is obtained at 1.5 GHz. It has to be noted that increasing the value of the photoresistor above 100Ω does not result in any significant increase in phase shift but rather increases the insertion loss.

Figure 4A:
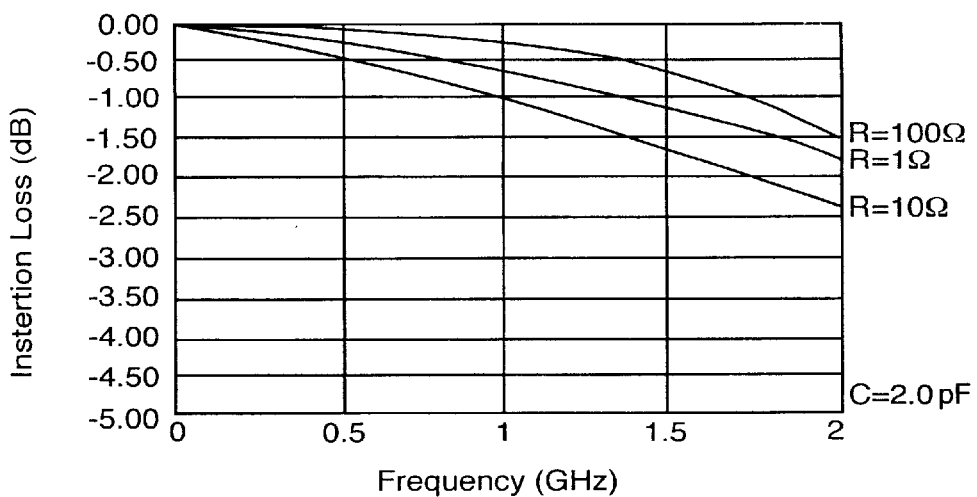
FIGS. 4A–4C show the frequency dependence of the insertion loss for one embodiment of this invention with values of the capacitances C1, C2 and C3.
Figure 4B:
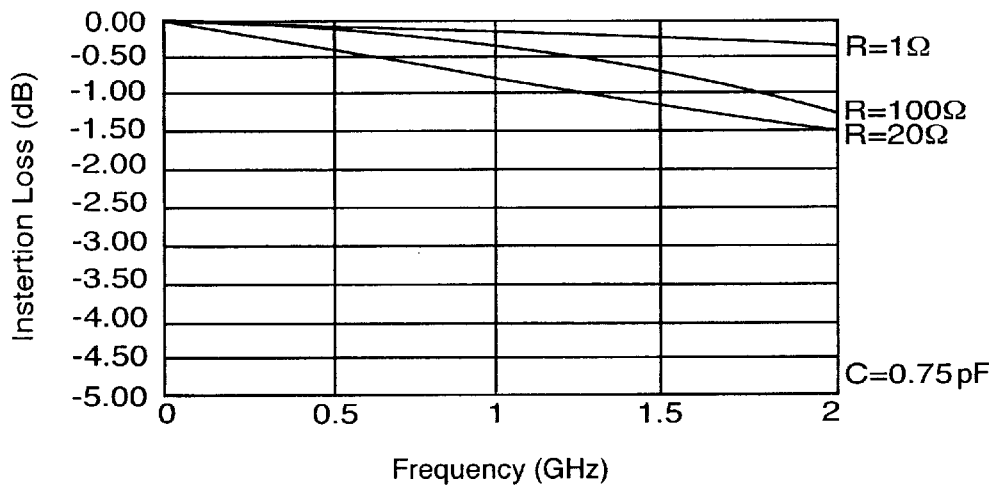
Figure 4C:
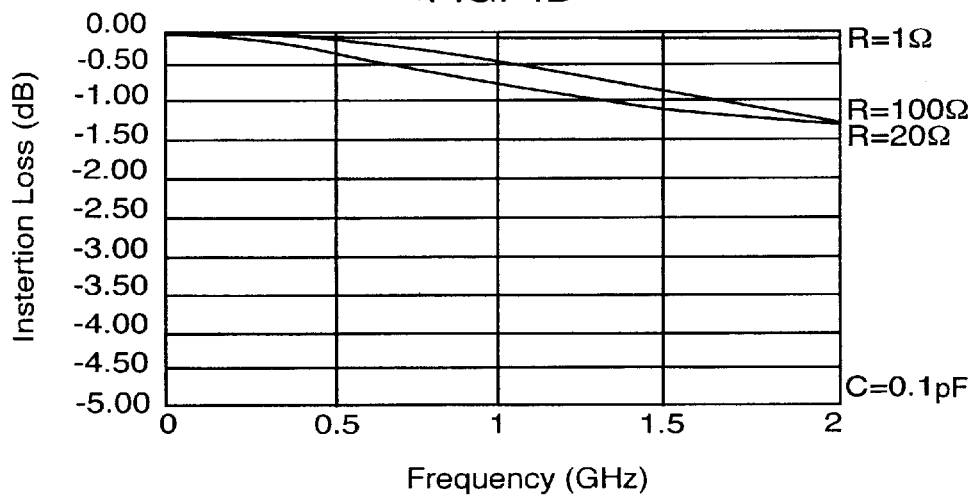

The other important parameter of the phase shifter is the insertion loss. The simulated frequency dependence of the insertion loss of the phase shifter according to the present invention is shown in FIGS. 4A, 4B and 4C. The goal, as already explained above, is to have an insertion loss of less than 3 dB at any frequency of operation. Due to the low pass filter nature of the RLC network in the fine tuning segment of this device, the insertion loss increases with frequency. It can be noted that in the frequency range of 1.5 to 2.5 GHz, a maximum phase shift of at least 45° is obtained in this segment of the device resulting in a total phase shift of 0° to 360° in the overall phase shifter.

The values of 0.1, 0.75 and 2 pF are the preferred values for the capacitances C1, C2 and C3 shown in FIGS. 4A, 4B, and 4C. These values for the capacitor C determine the range of phase shifting obtainable in the above example. For instance, for C=2 pF, the range of values for the phase shift at 2 GHz are from 30° to 60° as the photoresistor is varied from 1 to 100Ω, while for C=0.75 pF, the range of this phase shift is from 15° to 30°, and finally for C=0.1 pF, this range is from 0° to 20°.

According to the present invention, variation of resistance R is obtained by the photoconductivity effect. In a semiconductor such as Si, dark resistivities (i.e. resistivities in absence of light) as high as 100Ω·cm can be easily obtained in low doped material. Assuming a slab of this material with an electrical length of l and a width and depth of w and d, respectively, a dark resistance of $R_0$=100Ω can be obtained if $l/(d·w)$=1 cm$^{-1}$. The same slab of material has a photo-induced resistance (photoresistance), $R_\lambda$, which is given by the following equation:

$$R_\lambda = (hvl^2)/(q\eta P_\lambda \mu_n \tau) \quad (4)$$

where hv is the photon energy, $P_\lambda$ is the optical power of the incident light resulting in the photoconductivity effect, η is the quantum efficiency, $\mu_n$ and τ are the carrier mobility and lifetime in the semiconductor, and q is the electronic charge. Assuming a carrier mobility of 1000 cm$^2$/V·s and a lifetime of 100 μs, which is well achievable in lightly doped Si, an optical power of only 1.3–2.5 mW in the visible to the near infrared (λ=400–1100 nm) is required to obtain a photoresistance of 1Ω in a 100 μm long slab of Si with a quantum efficiency of close to unity. Thus, by varying the optical power from 0 to 2.5 mW, continuous change in the photoresistance from 100 to 1Ω can be achieved, which in turn results in a continuous phase change of 0°–45° in the RLC network described above. Any semiconductor with values of the carrier mobility and lifetime which can result in a low value (about 1Ω) of $R_\lambda$ in Equation (4) at reasonable values of optical power (<10 mW) and geometrical dimensions (<1 mm), as well as a high value of dark resistivity (>100Ω·cm) to result in a high value of dark photoresistance (>100Ω) is usable.

This, together with the 3-bit binary delay line phase shifter, results in a continuous 0–360° phase shift in the device according to the present invention. Moreover, by changing the values of the inductor and/or capacitor in the RLC network, the bandwidth of the phase shifter can be adjusted. It has to be noted that decreasing the values of L and C increases the operational bandwidth of the phase shifter. On the other hand, increasing the values of L and C results in the reduction of the operation bandwidth. For example, for a value of L=1 nH and C=0.2 pF, a maximum phase shifts of more than 55° and 45° are obtained at 10 and 7.5 GHz respectively, with corresponding insertion losses of less than 3 dB. In this configuration, the analog fine tuning segment of this phase shifter results in a phase shift of 25° to 55° at 10 GHz for photoresistor values of 1 to 100Ω. Furthermore, capacitance values of 0.05 pF and 0.01 pF change the phase shifting range to 5°–35° and 0°–20° respectively. Again, as in the previous example for the case of 2 GHz operation, a full phase tuning of 0° to more than 55° is achieved by switching three values of the capacitance. This together with the coarse tuning stage with the delay line widths designed for a maximum of 360° at 10 GHz, a full phase tuning from 0° to 360° at 10 GHz is achieved with an insertion loss below 3 dB.

Besides offering continuously variable RF phase shifting at a large bandwidth, the device according to the present invention has also the capability of being fully integrated, thus resulting in a compact and low cost RF phase shifter. This is due to the fact that, according to its preferred embodiment, the device consists of already established RF MEMs switches fabricated on Si or GaAs, and a simple RLC network which can easily be monolithically integrated with the MEMs switches. The optical power for varying the photoresistance can be supplied by inexpensive LEDs, either monolithically integrated for a phase shifter built on a compound semiconductor substrate, or easily attached in a hybrid fashion for devices built on Si, as described below.

The order of the fine and coarse tuning stages according to the present invention is not important. The fine tuning stage is preferably analog in order to result in a continuous phase shifting. If the fine tuning stage is digital, even with a high number of tuning bits, it will no longer be completely continuous. The coarse tuning stage can in principle be analog as well as digital. However, it is preferred to be digital with a low number of bits in order to simplify the overall structure of the continuously tunable phase shifter.

The invention has been described with reference to a particular embodiment. Modifications and alterations will occur to others upon reading and understanding this specification. It is intended that all such modifications and alterations are included insofar as they come within the scope of the appended claims or equivalents thereof.

What is claimed is:

1. A phase shifter comprising:
    a coarse phase tuning arrangement providing a discrete number of phase shifts; and
    a fine phase tuning arrangement, including:
        a RLC network serially connected to the coarse phase tuning arrangement, having a resistor, an inductor and a first capacitor; and
        an optical arrangement for optically varying the resistance value of the resistor.

2. The phase shifter of claim 1, wherein the coarse phase tuning arrangement comprises a three-bit binary phase shifter.

3. The phase shifter of claim 2, wherein the coarse phase tuning arrangement provides phase shifts of 45°, 90°, 135°, 180°, 225°, 270°, 315° and 360° and the fine phase tuning arrangement provides an additional phase shift in a range between 0° and 45°.

4. The phase shifter of claim 1, wherein the coarse phase tuning arrangement comprises a plurality of delay lines.

5. The phase shifter of claim 4, wherein said delay lines are MEMs-switched delay lines.

6. The phase shifter of claim 1, wherein the inductor is made of a microstrip line.

7. The phase shifter of claim 6, wherein the inductor is a spiral inductor.

8. The phase shifter of claim 1, wherein the RLC network further comprises a second capacitor and a third capacitor.

9. The phase shifter of claim 8, wherein each of said first, second, and third capacitor covers a portion of a phase shift range between 0° and 45°.

10. The phase shifter of claim 1, wherein the resistor is optically varied between 1Ω and 100 Ω.

11. The phase shifter of claim 1, where the inductor has a variable inductance and the first capacitor has a variable capacitance.

12. The phase shifter of claim 1, wherein the coarse phase tuning arrangement and the fine phase tuning arrangement are built on a silicon-on-insulator substrate.

13. The phase shifter of claim 12, wherein the first capacitor is fabricated using a metal-oxide-semiconductor structure.

14. The phase shifter of claim 1,
    wherein the optical arrangement comprises:
        an optical fiber optically coupled to the resistor; and
        a LED or laser diode optically coupled to the optical fiber.

15. The phase shifter of claim 1,
    wherein the optical arrangement comprises:
        an optical waveguide coupling light to the resistor; and
        a LED or laser diode optically coupled to the optical waveguide.

16. The phase shifter of claim 1, wherein the phase shifter is made without active devices.

17. A phase shifter comprising:
    a coarse phase tuning arrangement providing a discrete number of phase shifts; and
    a fine phase tuning arrangement, including:
        a RLC network serially connected to the coarse phase tuning arrangement, having a resistor, an inductor and a first capacitor, wherein the resistor is in parallel with the inductor, and the resistor and the inductor are in series with the first capacitor; and
        an optical arrangement for optically varying the resistance value of the resistor.

18. A phase shifter comprising:
    a coarse phase tuning arrangement providing a discrete number of phase shifts; and
    a fine phase tuning arrangement, including:
        a RLC network serially connected to the coarse phase tuning arrangement, having a resistor, an inductor and a first, second, and third capacitor, wherein the resistor is in parallel with the inductor, and the resistor and the inductor are in series with the first, second and third capacitor; and
        an optical arrangement for optically varying the resistance value of the resistor.

19. The phase shifter of claim 18, wherein the first, second and third capacitor are selectively connectable to the inductor and to the resistor through a respective first, second and third switch.

20. The phase shifter of claim 18, wherein the inductor has a value L=3 nH, the first capacitor has a value C1=0.1 pF, the second capacitor has a value C2=0.75 pF and the third capacitor has a value C3=2 pF.

21. The phase shifter of claim 20, wherein the resistor is optically varied between 1Ω and 100Ω.

22. A phase shifter comprising:
    a coarse phase tuning arrangement providing a discrete number of phase shifts; and
    a fine phase tuning arrangement, including:
        a RLC network serially connected to the coarse phase tuning arrangement, having a resistor, an inductor and a first capacitor; and
        an optical arrangement for optically varying the resistance value of the resistor,
        wherein the optical arrangement comprises:
            an optical fiber optically coupled to the resistor;
            a LED or laser diode optically coupled to the fiber; and
            a groove for supporting the optical fiber.

23. A phase shifter comprising:
    a coarse phase tuning arrangement providing a discrete number of phase shifts; and
    a fine phase tuning arrangement, including:
        a RLC network serially connected to the coarse phase tuning arrangement, having a resistor, an inductor and a first capacitor; and
        an optical arrangement for optically varying the resistance value of the resistor,
        wherein the optical arrangement comprises:
            a multimode optical fiber optically coupled to the resistor; and
            a LED or laser diode optically coupled to the fiber.

24. A phase shifter comprising:
    a coarse phase tuning arrangement comprising a plurality of delay lines and providing a discrete number of phase shifts; and a fine phase tuning arrangement, including:
  a RLC network serially connected to the coarse phase tuning arrangement, having a resistor, an inductor and a first capacitor; and
  an optical arrangement for optically varying the resistance value of the resistor,
  wherein the optical arrangement comprises:
    an optical fiber optically coupled to the resistor; and
    a LED or laser diode optically coupled to the fiber.

25. The phase shifter of claim 24, wherein the delay lines are MEMs-switched delay lines.

26. A continuous phase shifting method comprising the steps of:
  providing a RLC network having a resistor, an inductor and a first capacitor;
  optically continuously varying the resistance value of the resistor; and
  providing discrete phase shifts of 45°, 90°, 135°, 180°, 225°, 270°, 315° and 360°, said RLC network providing an additional continuous phase shift in a range between 0° and 45°.

27. The method of claim 26, wherein the inductor is made of a microstrip line.

28. The method of claim 26, wherein the RLC network further comprises a second capacitor and a third capacitor.

29. A continuous phase shifting method comprising the steps of:
  providing a RLC network having a resistor, an inductor and a first, second and third capacitor, wherein the inductor has a value $L=3$ nH, the first capacitor has a value $C1=0.1$ pF, the second capacitor has a value $C2=0.75$ pF and the third capacitor has a value $C3=2$ pF; and
  optically continuously varying the resistance value of the resistor.

30. The method of claim 29, wherein the resistor is optically varied between $1\Omega$ and $100\Omega$.

* * * * *